United States Patent
Tsukamoto

(10) Patent No.: US 6,197,657 B1
(45) Date of Patent: Mar. 6, 2001

(54) METHOD FOR PRODUCING A SEMICONDUCTOR DEVICE

(75) Inventor: Takeo Tsukamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/095,497

(22) Filed: Jun. 11, 1998

(30) Foreign Application Priority Data

Jun. 13, 1997 (JP) .................................................... 9-172866

(51) Int. Cl.[7] ...................................................... H01L 21/76
(52) U.S. Cl. ............................ 438/424; 438/221; 438/427
(58) Field of Search ..................................... 438/221, 296, 438/359, 424, 427, 428, 433, 434, 435, 436, 437

(56) References Cited

U.S. PATENT DOCUMENTS

| 4,419,813 | * | 12/1983 | Iwai ...................... 438/433 |
| 5,229,316 | | 7/1993 | Lee et al. ............... 437/67 |
| 5,358,891 | | 10/1994 | Tsang et al. ............ 437/67 |
| 5,387,540 | * | 2/1995 | Poon et al. ............. 438/430 |
| 5,433,794 | * | 7/1995 | Fazan et al. ........... 148/33.3 |
| 5,506,168 | * | 4/1996 | Morita et al. .......... 438/424 |
| 5,933,748 | | 8/1999 | Chou et al. ........... 438/431 |
| 5,960,298 | * | 9/1999 | Kim ...................... 438/424 |

FOREIGN PATENT DOCUMENTS

| 2 326 526 | 12/1998 | (GB) . |
| 7-176607 | 7/1995 | (JP) . |
| 8-330410 | 12/1996 | (JP) . |

OTHER PUBLICATIONS

Andres Bryant et al., "Characteristics of CMOS Device Isolation for the ULSI Age", *IEDM* 94, 1994, pp. 671–675.

* cited by examiner

Primary Examiner—Wael Fahmy
Assistant Examiner—Jeff Vockrodt
(74) Attorney, Agent, or Firm—Sughrue, Mion, Zinn, Macpeak & Seas, PLLC

(57) ABSTRACT

A manufacturing method for a semiconductor device in which, when a silicon oxide film on a semiconductor substrate is wet-etched for trench device isolation, no divot is formed at a device isolation end due to etching of a first insulating film of a trench isolation region to improve yield as well as reliability and productivity. A second insulating film (7 of FIG. 2) is formed and etched to leave a second insulating film 7a selectively in the rim of a isolation region where a divot is likely to be formed to prevent the divot from being formed by wet etching.

22 Claims, 7 Drawing Sheets

1 : SILICON SUBSTRATE
2 : SILICON OXIDE FILM
3 : STOP FILM
4 : MASK
5 : TRENCH
6 : FIRST INSULATING FILM

1 : SILICON SUBSTRATE
2 : SILICON OXIDE FILM
5 : TRENCH
7 : SECOND INSULATING FILM

8 : SILICON SUBSTRATE
9 : SILICON OXIDE FILM
10 : STOP FILM
11 : MASK
12 : TRENCH
13 : FIRST INSULATING FILM

8 : SILICON SUBSTRATE
12 : TRENCH
14 : RECESS

16 : SILICON SUBSTRATE
17 : SILICON OXIDE FILM
18 : STOP FILM
19 : MASK
20 : TRENCH
21 : INSULATING FILM
22 : RECESS

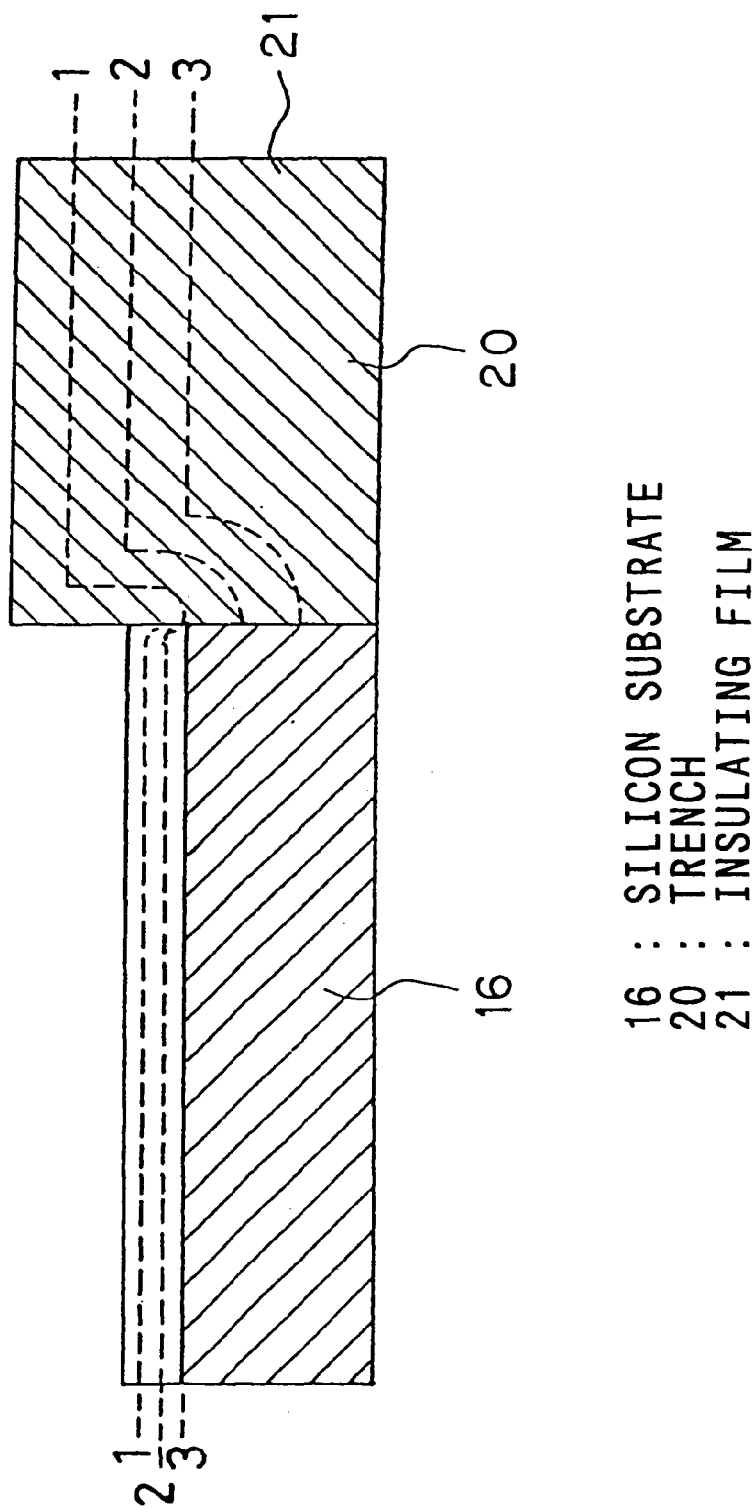

METHOD FOR PRODUCING A SEMICONDUCTOR DEVICE

FIELD OF THE INVENTION

This invention relates to a method for producing a semiconductor device. More particularly, it relates to a method for forming a shallow trench isolation (STI).

DISCUSSION ON THE RELATED ART

FIG. 6 illustrates an example of a conventional trench device isolation forming method, and is a cross-sectional view of a semiconductor substrate for schematically showing the production process step-by-step.

First, a silicon oxide film 17 is formed by thermal oxidation on a silicon substrate 16 to a film thickness of 300 Å (30 nm). On the silicon oxide film 17, there is formed, as a stop film 18 for chemical mechanical polishing (CMP), a silicon nitride film, having a polishing rate by CMP lower than that of an insulating film used for device isolation (silicon oxide film), to a film thickness of 1000 Å (100 nm) by chemical vapor deposition (CVD).

The role of the initially formed silicon oxide film 17 is to relieve the stress between the silicon nitride film as the stop film 18 and the silicon substrate 16.

Then, a mask 19 is selectively formed by a well-known photolithographic technique in an area which is later converted to a diffusion layer (active region).

Then, an area not covered by the mask 19, that is the stop film 18 and the silicon oxide film 17 of the isolation regions, is removed by anisotropic etching. The silicon substrate 16 is also anisotropically etched to a depth of 3000 Å (300 nm) to form a trench 20 in the isolation region.

After forming the trench 20, the mask 19 is removed and a silicon oxide film as an insulating film is formed on the entire surface of the semiconductor substrate to a film thickness of 4500 Å (450 nm) by CVD to fill the trench 20.

Then, planarization is carried out by CMP until the stop film 18 on the diffusion layer (active region) is completely exposed, as shown in FIG. 6c. After CMP, the stop film 18 has a film thickness is of the order of 600 Å (60 nm), having been slightly polished.

As a matter of course, the upper surface of the insulating film on the isolation regions is of substantially the same height as the upper surface of the stop film 18.

Then, the stop film 18 is removed by etching, as shown in FIG. 6d. For etching, wet etching by phosphoric acid, having a high etching selectivity of the stop film (nitride film) as compared to the silicon oxide film, is usually employed.

The result is that an insulating film 21a, protruded approximately 600 Å (60 nm) from the wafer surface, is produced in the isolation regions.

Then, the silicon oxide film 17 of a film thickness of 300 Å (30 nm) is wet-etched for removing the silicon oxide film. For this wet etching, a hydrofluoric acid or a hydrofluoric acid-containing liquid, affecting the underlayer to a lesser extent, is used.

Since the insulating film 21a also is a silicon oxide film, it is also etched at this time. However, the silicon oxide film by CVD is coarser than the silicon oxide film formed by thermal oxidation, with the etching rate by wet etching being typically faster by a factor of approximately three times by CVD than that by thermal oxidation.

Thus, there is formed a divot 22 with a radius of 300 Å (30 nm) around the insulating film 21a of the isolation regions to expose the sidewall of the trench 20.

The process of formation of the divot (recess) 22 is explained with reference to FIG. 7, which is a cross-sectional view showing the rim of the trench device isolating area of FIG. 6d to an enlarged scale.

If the silicon oxide film 17 with the film thickness of 300 Å (30 nm) by the thermal oxidation is wet-etched, the insulating film 21a, which is the silicon oxide film by CVD, is etched by approximately 900 Å (90 nm), so that the height of the upper surface is equal to that of the silicon substrate 16.

However, since the wet etching is isotropic, it proceeds from a broken line 1 to a broken line 3 in FIG. 7, around the rim of the isolation regions, until the divot 22 is ultimately formed, as shown in FIG. 6e.

If a gate oxide film and a gate electrode are formed in this state for fabricating a transistor, there is formed unintentionally a transistor, on the trench sidewall of the diffusion layer (active region) and in particular at a corner where the electrical field is concentrated as discussed by Andres Bryant in a thesis ("Characteristics of CMOS Device Isolation for the ULSI Age" IDEM Tech. Dig., p. 671, 1994), thus producing adverse effects, known as humps or kinks, on inherent transistor characteristics.

There are also occasions where, in etching the gate electrode, the gate electrode material is left in the divot in the form of side walls due to sharp step difference by the divot to give rise to shorting across gate electrodes.

As discussed above, since a divot is produced around the isolation region with the conventional trench device isolation forming method, there is unintentionally formed a transistor in the trench sidewall of the diffusion layer (active region), in particular at a corner where the electrical field is concentrated, thus giving rise to adverse effects termed humps or kinks on the inherent transistor characteristics.

There are also occasions wherein, in gate etching, the gate electrode material is left in the divot in the form of sidewalls due to sharp step difference by the divot to give rise to shorting across gate electrodes.

In view of the above-described problems of the prior art, it is an object of the present invention to provide a method for producing a semiconductor device in which, in wet etching the silicon oxide film on the semiconductor substrate during formation of the shallow trench isolation (STI), the first insulating layer of the isolation region is prevented from being etched to produce a divot at the isolation end region to improve the yield, reliability and productivity of the semiconductor device.

Further objects of the present invention will become apparent in the entire disclosure.

For accomplishing the above object, the present invention generally resides in selectively forming an insulating film in a trench rim portion where a divot is likely to be produced for preventing the divot from being produced, or in forming a divot and subsequently selectively forming an insulating film in this divot for eliminating the divot prior to formation of the gate oxide film.

More specifically, one aspect of the present invention resides in a method for producing a semiconductor device including (a) forming a stop film for planarization over a semiconductor substrate, (b) removing the stop film of isolation regions by etching and further etching the semiconductor substrate to form a trench, (c) forming a first insulating film on the semiconductor substrate to fill the trench, (d) removing the first insulating film on the stop film by planarization, (e) removing the stop film, (f) forming a second insulating film after removing the stop film and before forming a gate oxide film and (g) etching the second insulating film.

According to the present invention, first and second insulating films are formed by chemical vapor deposition (CVD).

According to the present invention, planarization is achieved by chemical mechanical polishing (CMP).

According to the present invention, etching of the second insulating film is carried out by isotropic etching. Preferably, the etching is wet etching.

According to the present invention, the second insulating film is a silicon oxide film.

BRIEF DESCRIPTION OF THE DRAWINGS

FIG. 7 is a cross-sectional view of a semiconductor substrate showing the isolation end portion to an enlarged scale.

PREFERRED EMBODIMENTS OF THE INVENTION

Figure 1:
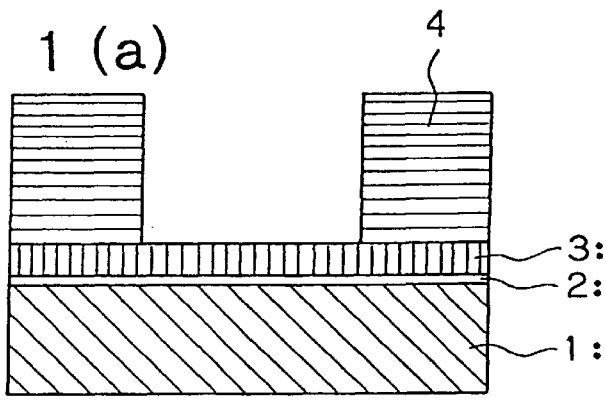
FIGS. 1a to 1d are cross-sectional process views for illustrating the manufacturing method of a first embodiment of the present invention.
Figure 1:
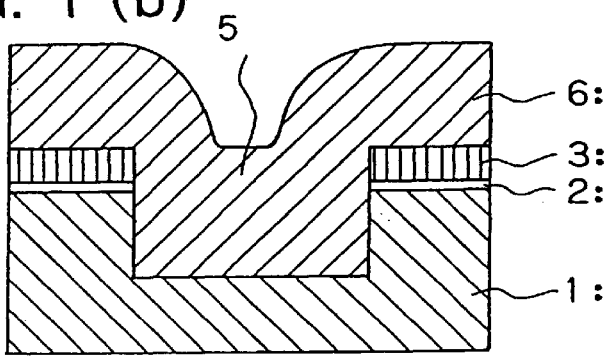
Figure 1:
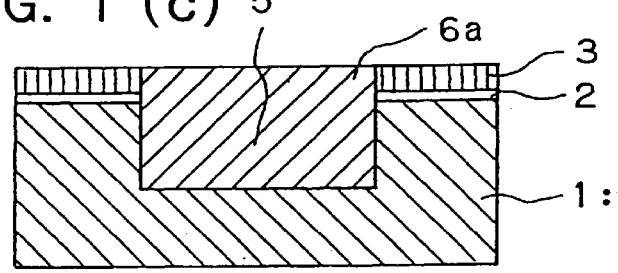
Figure 1:
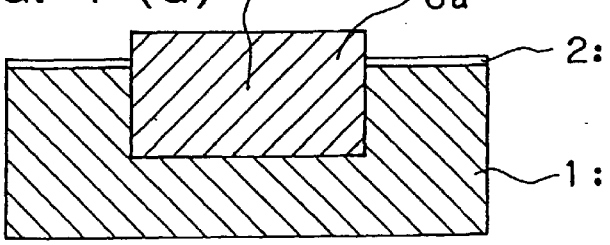

Preferred embodiments of the present invention are hereinafter explained. In its preferred form, there is provided a method for producing a semiconductor device in which a first insulating film is buried in a trench provided in a semiconductor substrate and a shallow trench isolation region is formed by planarization. In this method, after planarization and removing a stop film for planarization, and before forming a gate electrode, a second insulating film is formed, and wherein this second insulating film is etched to selectively leave the second insulating film around the sidewall of the first insulating film protruded from the substrate surface of the shallow trench insulation region in a fashion to prevent a divot from being formed around the shallow trench isolation region during the next following etching process.

More specifically, there is provided a method for producing a semiconductor device. The method comprises:
(a) a step for forming a stop film for planarization (3 of FIG. 1) over a semiconductor substrate (1 of FIG. 1) via a silicon oxide film (2 of FIG. 1) as a stress-relieving insulating film see FIG. 1a),
(b) a step for removing the stop film (3 of FIG. 1) and the silicon oxide film (2 of FIG. 1) in isolation regions by etching and further etching the semiconductor substrate (1 of FIG. 1) to form a trench (5 of FIG. 1), and forming a first insulating film (6 of FIG. 1) on the semiconductor substrate to fill the trench (see FIG. 1b). The method further comprises:
(c) a step of removing the first insulating film (6 of FIG. 1) on the stop film (3 of FIG. 1) by planarization (see FIG. 1c),
(d) a step of removing the stop film (see FIG. 1d),
(e) a step of forming a second insulating film (7 of FIG. 2) after removing the stop film and before forming a gate oxide film (see FIG. 2(a),
(f) a step of removing the second insulating film by etching (see FIG. 2(b), and
(g) a step of removing the silicon oxide film (2 of FIG. 1) on etching (see FIG. 2(c).

Also, there is provided a method for producing a semiconductor device in which a first insulating film is buried in a trench provided in a semiconductor substrate and a shallow trench isolation region is formed by planarization. In this method, after planarization, an insulating film for stress relieving between the semiconductor substrate and the stop film is removed by etching after removing a stop film for planarization, and before forming a gate electrode, and subsequently a second insulating film is formed to fill a divot around the shallow trench isolation region formed at the time of removal of the stress-relieving insulating film by etching to prevent a divot from being formed around the shallow trench isolation region during the subsequent etching process.

More specifically, there is provided a method for producing a semiconductor device comprising:
(a) a step for forming a stop film for planarization (10 of FIG. 4) over a semiconductor substrate (8 of FIG. 4) via a stress-relieving silicon oxide film (9 of FIG. 4) (see FIG. 4a),
(b) a step for removing the stop film and the stress-relieving insulating film in a isolation regions by etching, and etching the semiconductor substrate to form a trench (12 of FIG. 4), and forming a first insulating film over the semiconductor substrate to fill the trench (see FIG. 4b),
(c) a step of removing the first insulating film on the stop film by planarization (see FIG. 4c),
(d) a step of removing the stop film (see FIG. 4d),
(e) removing the silicon oxide film (9 of FIG. 4) by etching after removing the stop film (see FIG. 5(a),
(f) forming a second insulating film (15 of FIG. 5) to cover the divot around the trench produced by the step (e) (FIG. 5(b), and
(g) removing the second insulating film by etching (FIG. 5(c).

In the embodiments of the present invention, the first and second insulating films are formed preferably by CVD, while planarization is performed by CMP (chemical mechanical polishing). The second insulating film is preferably etched by wet etching.

In the embodiments of the present invention, since the divot around the shallow trench isolation region is eliminated before forming the gate oxide film, it is possible to eliminate humps in transistor characteristics or residual step difference at the time of etching the gate electrode.

DETAILED DESCRIPTION OF THE EMBODIMENTS

Figure 2:
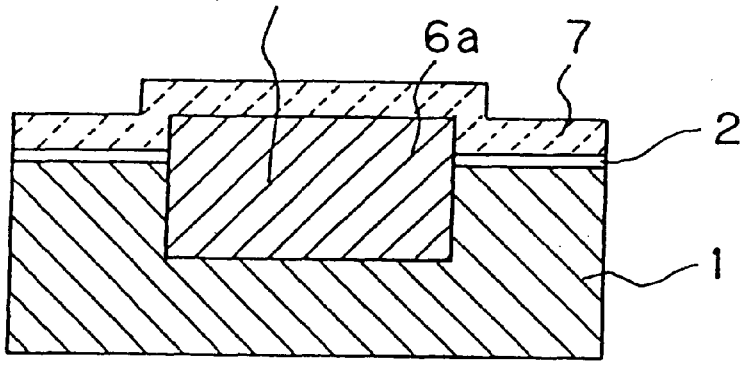
FIGS. 2(a) to 2(c) are cross-sectional process views for illustrating the manufacturing method of the first embodiment of the present invention.
Figure 2:
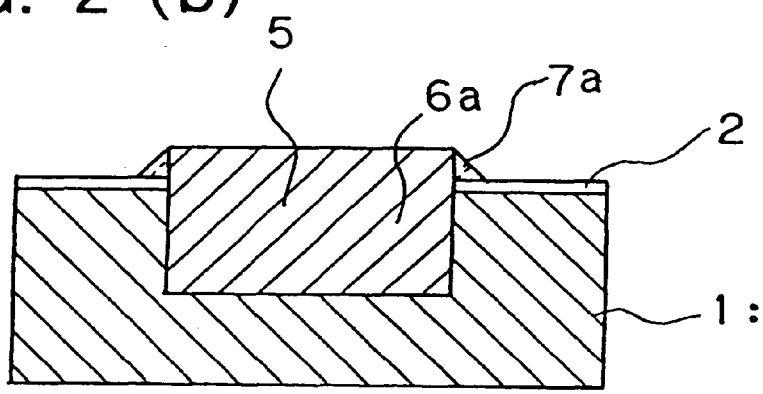
Figure 2:
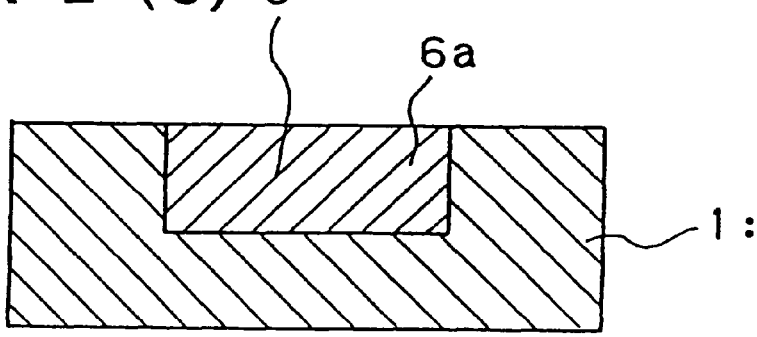

Referring to the drawings, preferred embodiments of the present invention will be explained in detail.
First Embodiment Referring to the drawings, a first embodiment of the present invention is explained. FIGS. 1 and 2 illustrate the manufacturing method of the first embodiment of the present invention and are cross-sectional process views of the semiconductor substrate step-by-step. FIGS. 1 and 2 are divided simply for convenience in preparing the drawings.

Referring first to FIG. 1a, a silicon oxide film 2 is formed to a film thickness of 300 Å (30 nm) by thermal oxidation on a silicon substrate 1. On the silicon oxide film 2, a silicon nitride film, as a stop film for CMP 3, having a polishing rate by CMP smaller than that of the insulating film used for device isolation (silicon oxide film in the present embodiment) is formed by CVD to a film thickness of 1000 Å (100 nm). The role of the initially formed silicon oxide film 2 is to relieve the stress between the silicon nitride film as the stop film 3 and the silicon substrate 1.

Then, by a well-known photolithographic technique, a mask 4 is selectively formed in an area which later serves as a diffusion layer (active region).

The portions of the stop film 3 and the silicon oxide film 2 not covered by the mask 4, that is in the device isolating area, are then removed by anisotropic etching. The portion of the silicon substrate 1 in the device isolating area is then anisotropically etched to a depth of 3000 Å (300 nm) to form a trench 5 in the isolation region.

After forming the trench 5, the mask 4 is removed, and a silicon oxide film as a first insulating film 6 is formed on the entire surface of the semiconductor substrate to a film thickness of 4500 Å (450 nm) by CVD to fill the trench 5.

Then, planarization by CMP is carried out until the stop film 4 on the diffusion layer (active region) is exposed completely, as shown in FIG. 1c.

Through the CMP, the stop film 3 is also polished to a film thickness equal to 600 Å (60 nm). As a matter of fact, the upper surface of the first insulating film 6a on the isolation region is substantially of the same height level as the upper surface of the stop film 3.

Then, the stop film 3 is removed by etching, as shown in FIG. 1d. This etching is usually wet etching by phosphoric acid which has a high selection ratio relative to the silicon oxide film.

The result is that a first insulating film 6a, protruded by a height of 600 Å (60 nm) from the wafer (substrate) surface, is formed in the isolation region.

Then, a silicon oxide film as a second insulating film 7 is formed to a film thickness of 600 Å (60 nm) on the semiconductor substrate.

The second insulating film 7, with the film thickness of 600 Å (60 nm), is removed by etching, as shown in FIG. 2(b). As the etching technique, wet etching by a hydrofluoric acid-based etching solution, which damages the underlayer to a lesser extent, is used in the present embodiment.

Thus, in the planar portion, the second insulating film 7 is eliminated, while only the first silicon oxide film 2 is left. However, on the end of the isolation region (sidewall section of the first insulating film 6a), an insulating film 7a is left on the silicon oxide film 2.

Figure 3:
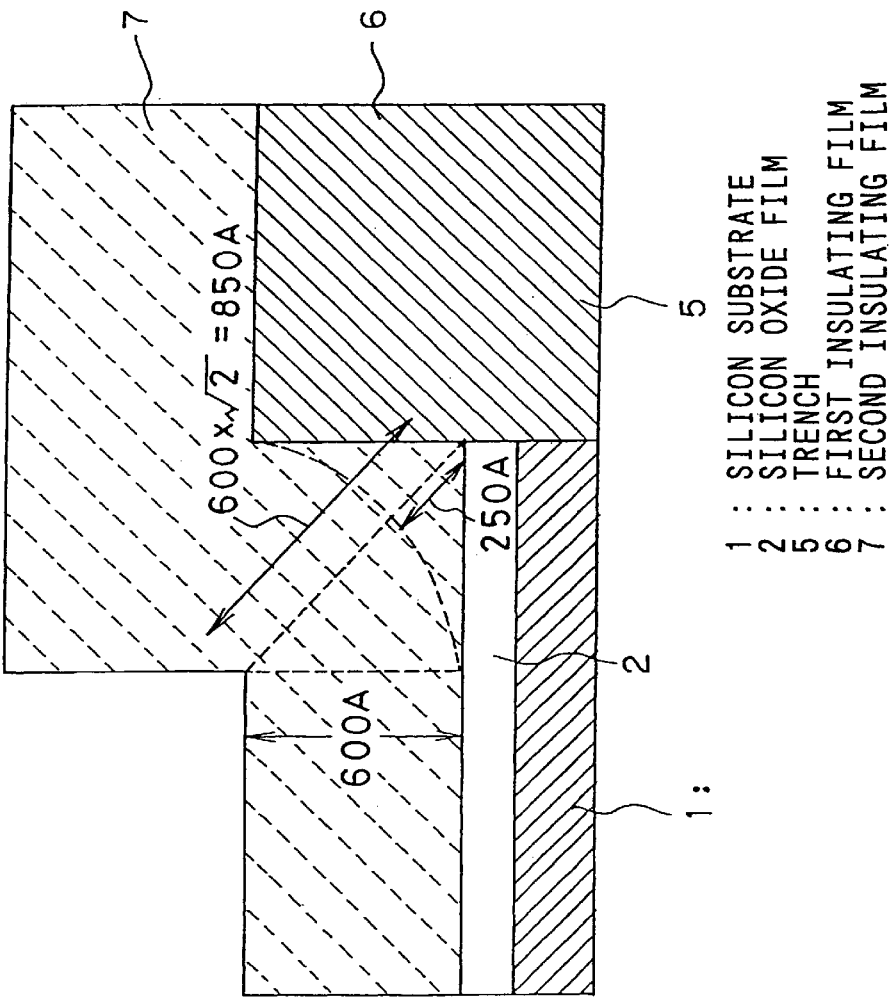
FIG. 3 is a cross-sectional view of a semiconductor substrate showing an isolation end portion.

This process is explained with reference to FIG. 3 showing the end of the isolation region of FIG. 2e to an enlarged scale.

In a planar portion, excluding the initially formed silicon oxide film 2, there is formed the second insulating film 7 to a film thickness of 600 Å (60 nm), while the second insulating film 7 of ($\sqrt{2}$)×≈850 Å (85 nm) is formed at an angle of 45 degrees from the horizontal from a corner at the end of the isolation regions.

If wet etching is carried out with 600 Å (60 nm), the second insulating film 7 on the planar portion is eliminated. However, at an angle of the end of the isolation regions, the insulating film 7a of ($\sqrt{2}$)×600−600 Å≈250 Å (25 nm) is left at the corner of the end of the isolation regions.

The silicon oxide film 2 is then removed by etching, as shown in FIG. 2g. Although the first insulating film 6a is etched by 600 Å (60 nm), the divot of the first insulating film 6a is of the order of 50 Å (50 nm) in radius so that it raises no problem.

Therefore, even if subsequently the gate oxidation or formation of a gate electrode is performed, there is raised no problem such as humps in transistor characteristics or residual gate electrode material.

In the present embodiment, the second insulating film 7a is transiently left at the end of the isolation regions and subsequently the silicon oxide film 2 is removed. This, however, is merely for convenience in explanation. That is, in the present embodiment, the second insulating film 7 also is an oxide film, such that, in actual fabrication, there is of course, no essential difference if the two etching operations are carried out at a time.

Second Embodiment

Figure 4:
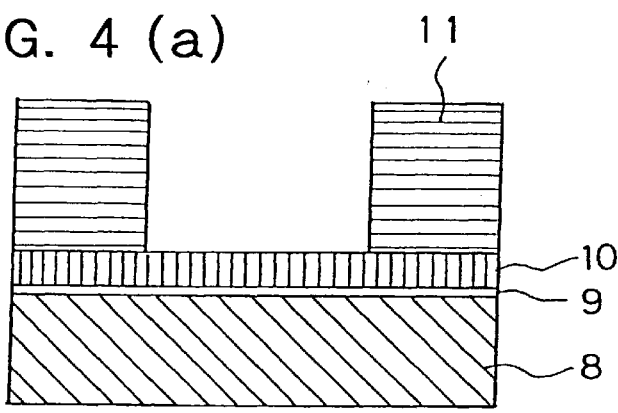
FIGS. 4a to 4d are cross-sectional process views for illustrating the manufacturing method of a second embodiment of the present invention.
Figure 4:
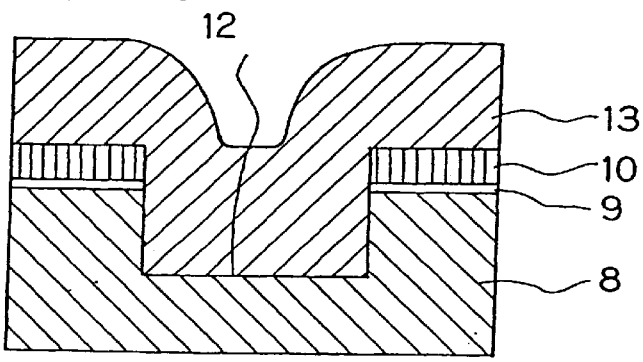
Figure 4:
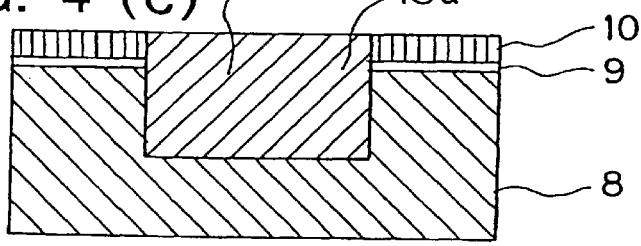
Figure 4:
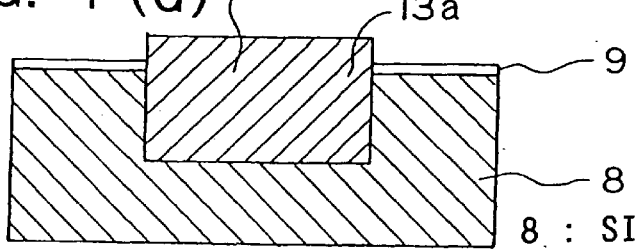
Figure 5:
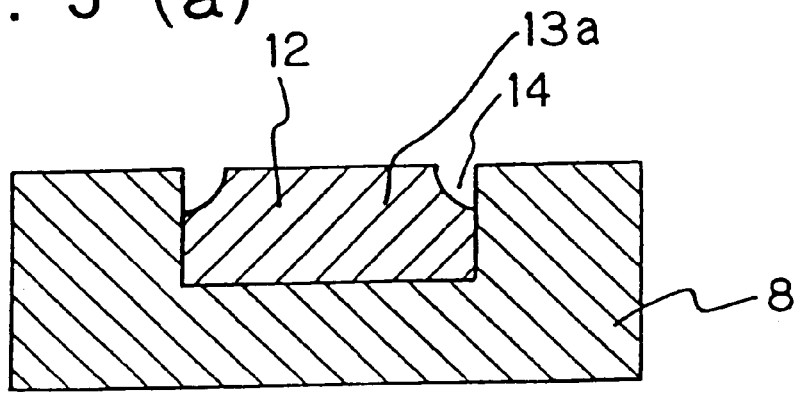
FIGS. 5(a) to 5(c) are cross-sectional process views for illustrating the manufacturing method of the second embodiment of the present invention.
Figure 5:
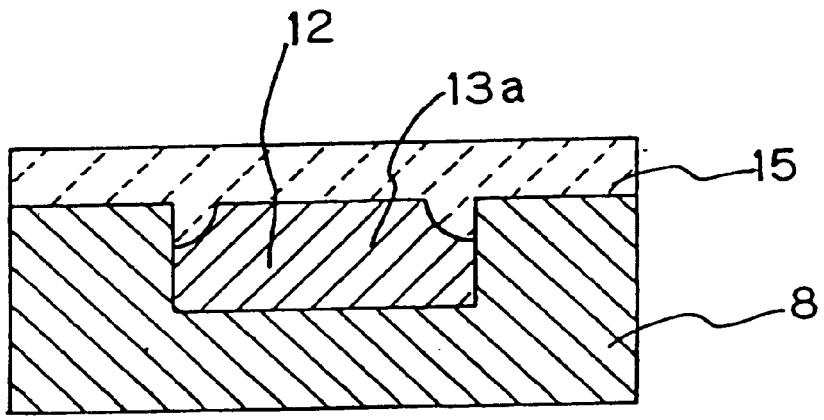
Figure 5:
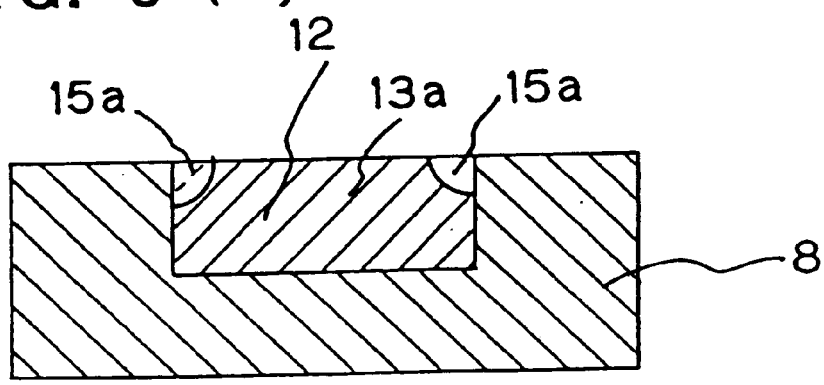
Figure 6:
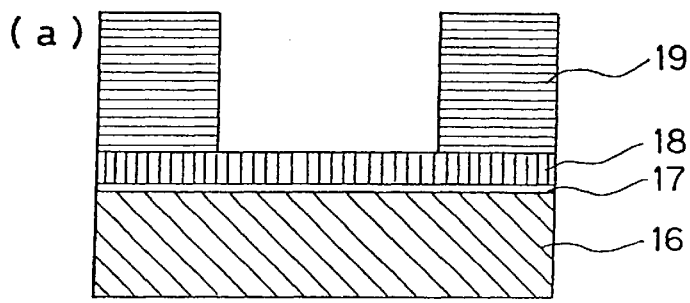
FIGS. 6a to 6e are cross-sectional process views for illustrating the manufacturing method for conventional shallow trench isolation (STI).
Figure 6:
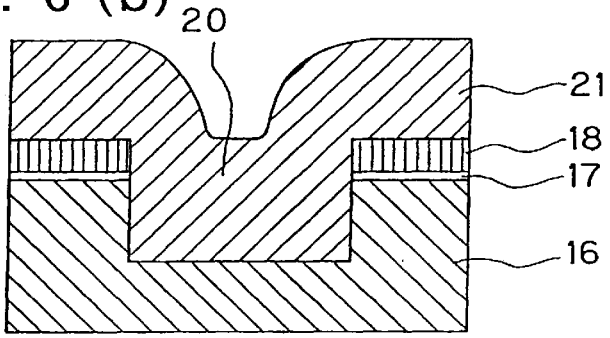
Figure 6:
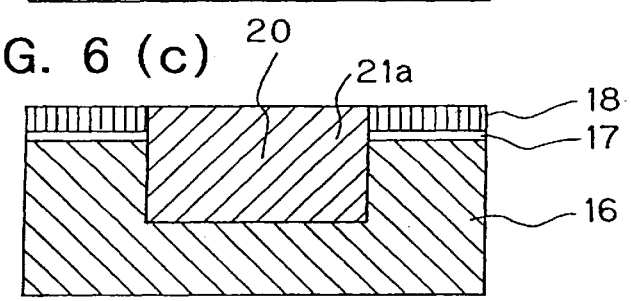
Figure 6:
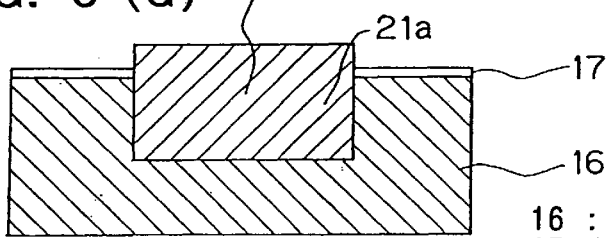
Figure 6:
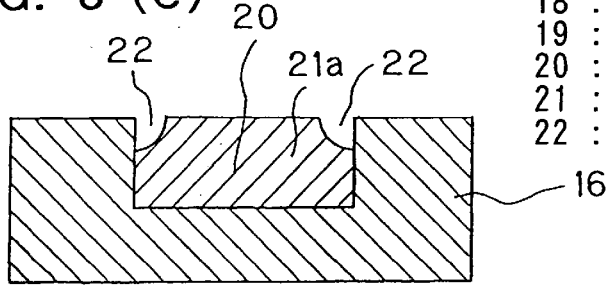

The second embodiment of the present invention is now explained with reference to the drawings. FIGS. 4 and 5 are cross-sectional views of a semiconductor substrate schematically showing the process for fabricating the semiconductor substrate step-by-step. FIGS. 4 and 5 are split only for convenience in drawing.

First, as shown in FIG. 4a, a silicon oxide film 9 is formed to a film thickness of 300 Å (30 nm) by thermal oxidation on a silicon substrate 8, whereas a silicon nitride film, having a CMP polishing rate lower than that of the insulating film used for device isolation (silicon oxide film in the present embodiment) is formed by CMP as a CMP stop film 10 on the silicon oxide film 9. The role of the initially formed silicon oxide film 9 is to relieve the stress between the silicon nitride film as the stop film 10 and the silicon substrate 8.

Then, by a well-known photolithographic technique, a mask 11 is selectively formed in an area which later serves as a diffusion layer (active region).

The portions of the stop film 10 and the silicon oxide film 9 not covered by the mask 11, that is in the isolation regions, are then removed by anisotropic etching. The portion of the silicon substrate 1 in the isolation regions is then anisotropically etched to a depth of 3000 Å (300 nm) to form a trench 12 in the isolation region.

After forming the trench 12, the mask 11 is removed, and a silicon oxide film as a first insulating film 13 is formed on the entire surface of the semiconductor substrate to a film thickness of 4500 Å (450 nm) by CVD to fill the trench 5.

Then, planarization by CMP is carried out until the stop film 10 on the diffusion layer (active region) is exposed completely. Through CMP, the stop film 10 is also polished so that its film thickness is equal to 600 Å (60 nm). As a matter of act, the upper surface of the first insulating film 13a in the isolation regions is substantially of the same height level as the upper surface of the stop film 10. Then, the stop film 10 is removed by etching, as shown in FIG. 4d. This etching is usually wet etching by phosphoric acid which has a high selection ratio relative to the silicon oxide film. The result is that a first insulating film 13a, protruded by a height of 600 Å (60 nm) from the wafer (substrate) surface, is formed in the isolation regions.

Then, wet etching by 300 Å (30 nm) is carried out to remove the silicon oxide film 9, as shown in FIG. 5(a).

Thus, there is formed a divot 14 with a radius of 300 Å (30 nm) around the first insulating film 13a of the isolation regions to expose the sidewall section of the trench, as explained with reference to the prior art technique.

Then, as shown in FIG. 5(b), preferably a silicon oxide film is formed as a second insulating film 15 by CVD to a film thickness of 1000 Å (100 nm) to fill the divot.

The second insulating film 15, with the film thickness of 1000 Å (100 nm), is removed by etching, as shown in FIG. 5f. As the etching technique, wet etching by a hydrofluoric acid based etching solution, which damages the underlayer to a lesser extent, is used in the present embodiment.

In the rim of the first insulating film 13a of the isolation region where there was the divot 14, the second insulating film 15a remains, thus realizing divot-free shallow trench isolation (STI). Thus, in the present embodiment, it is also possible to prevent humps or residual steps of the fate electrode.

According to the present invention, since the divot at the rim of the shallow trench isolation region is removed, it is possible to prevent adverse effects, such as humps or kinks, from affecting the electrical characteristics of the transistor. In addition, etching residues in the form of sidewalls otherwise produced at the time of gate etching can be eliminated to improve yield and reliability.

It should be noted that modification obvious in the art may be done without departing the gist and scope of the present invention as closed herein and claimed hereinbelow as appended.

What is claimed is:

1. A method for producing a semiconductor device comprising:
    (a) forming a stop film for planarization over a semiconductor substrate;
    (b) removing said stop film over an isolation region by etching and further etching said semiconductor substrate to form a trench;
    (c) forming a first insulating film on said semiconductor substrate to fill said trench;
    (d) removing said first insulating film on said stop film by planarization such that a top surface of the first insulating film in the trench is flush with a top surface of said stop film;
    (e) removing said stop film;
    (f) forming a second insulating film over said semiconductor substrate including said top surface of said first insulating film after removing said stop film and before forming a gate oxide film; and
    (g) etching said second insulating film, wherein a surface of insulating film in said trench is flush with a surface of the semiconductor substrate.

2. The method for producing a semicondictor device as defined in claim 1 wherein said first and second insulating films are formed by chemical vapor deposition (CVD).

3. The method for producing a semiconductor device as defined in claim 1 wherein said planarization is achieved by chemical mechanincal polishing (CMP).

4. The method for producing a semiconductor device as defined in claim 2 wherein etching of said second insulating film is carried out by isotropic etching.

5. The method for producing a semiconductor device as defined in claim 3 wherein said etching is wet etching.

6. The method for producing a semiconductor device as defined in claim 4 wherein said second insulating film is a silicon oxide film.

7. A method for producing a semiconductor device in which a first insulating film is buried in a trench provided in a semiconductor substrate and a trench isolation region is formed by planarization such that a top surface of the first insulating film is flush with a top surface of a stop film, wherein, after planarization and removing the stop film for planarization, and before forming a gate electrode, a second insulating film is formed, and wherein said second insulating film is etched to selectively leave portions of said second insulating film around a sidewall of the first insulating film protruded from the substrate surface of a trench device insulating area, in a fashion to prevent a divot from being formed around the trench isolation region during a subsequent etching process which etches a surface of insulating films in the trench to be flush with the substrate surface.

8. A method for producing a semiconductor device in which a first insulating film is buried in a trench provided in a semiconductor substrate such that said trench is filled entirely and a mass of said first insulating film projects out of said trench and a trench isolation region is formed by planarization, wherein, after planarization and removing a stop film for planarization, and before forming a gate electrode, an insulating film for stress relieving between the semiconductor substrate and said stop film is removed by etching, and wherein subsequently a second insulating film is formed to fill a divot around a shallow trench isolation (STI) area formed at the time of removal of the stress-relieving insulating film, wherein said second insulating film is removed by etching in a fashion that said second insulating film remains only in said divot, and such that a top surface of said first insulating film filled in said trench and a top surface of said second insulating film in said divot is flush with the substrate surface.

9. A method for producing a semiconductor device comprising:
    (a) forming a stop film for planarization over a semiconductor substrate via a stress-relieving insulating film;
    (b) removing said stop film and the stress-relieving insulating film above an isolation region by etching and further etching said semiconductor substrate to form a trench;
    (c) forming a first insulating film over said semiconductor substrate to fill said trench;
    (d) removing said first insulating film on said stop film by planarization;
    (e) removing said stop film;
    (f) forming a second insulating film after removing said stop film and before forming a gate oxide film;
    (g) removing said second insulating film by etching in a fashion to leave part of said second insulating film at a corner of the first insulating film at an end of the isolation region; and
    (h) removing the stress-relieving insulating film by etching such that a top surface of the isolation region is flush with a top surface of the semiconductor substrate.

10. A method for producing a semiconductor device comprising:
    (a) forming a stop film for planarization over a semiconductor substrate via a stress-relieving insulating film;
    (b) removing said stop film and the stress-relieving insulating film of an isolation region by etching and further etching said semiconductor substrate to form a trench;
    (c) forming a first insulating film over said semiconductor substrate to entirely fill said trench;
    (d) removing said first insulating film on said stop film by planarization;

(e) removing said stop film;

(f) removing said stress-relieving insulating film by etching after removing said stop film;

(g) forming a second insulating film on an entire substrate surface to fill a divot at the end of the isolation region; and (h) removing the second insulating film by etching, such that a portion of the second insulating film remains in said divot and a top surface of the first and second insulating films in the trench is flush with the substrate surface.

11. The method for producing a semiconductor device as defined in claim 7 wherein said first and second insulating films are formed by chemical vapor deposition (CVD) method.

12. The method for producing a semiconductor device as defined in claim 8 wherein said first and second insulating films are formed by chemical vapor deposition (CVD) method.

13. The method for producing a semiconductor device as defined in claim 9 wherein said first and second insulating films are formed by chemical vapor deposition (CVD) method.

14. The method for producing a semiconductor device as defined in claim 10 wherein said first and second insulating films are formed by chemical vapor deposition (CVD) method.

15. The method for producing a semiconductor device as defined in claim 7 wherein said planarization is by chemical mechanical polishing (CMP).

16. The method for producing a semiconductor device as defined in claim 8 wherein said planarization is by chemical mechanical polishing (CMP).

17. The method for producing a semiconductor device as defined in claim 9 wherein said planarization is by chemical mechanical polishing (CMP).

18. The method for producing a semiconductor device as defined in claim 10 wherein said planarization is by chemical mechanical polishing (CMP).

19. The method for producing a semiconductor device as defined in claim 7 wherein said etching of the second insulating film is performed by wet etching.

20. The method for producing a semiconductor device as defined in claim 8 wherein said etching of the second insulating film is performed by wet etching.

21. The method for producing a semiconductor device as defined in claim 9 wherein said etching of the second insulating film is performed by wet etching.

22. The method for producing a semiconductor device as defined in claim 10 wherein said etching of the second insulating film is performed by wet etching.

* * * * *